US011984518B2

(12) United States Patent
Peng et al.

(10) Patent No.: US 11,984,518 B2
(45) Date of Patent: May 14, 2024

(54) PHOTOVOLTAIC MODULE

(71) Applicants: ZHEJIANG JINKO SOLAR CO., LTD., Zhejiang (CN); JINKO SOLAR CO., LTD., Jiangxi (CN)

(72) Inventors: Yingying Peng, Zhejiang (CN); Yuhao Wu, Zhejiang (CN); Liang Guo, Zhejiang (CN)

(73) Assignees: ZHEJIANG JINKO SOLAR CO., LTD., Zhejiang (CN); JINKO SOLAR CO., LTD., Jiangxi (CN)

(*) Notice: Subject to any disclaimer, the term of this patent is extended or adjusted under 35 U.S.C. 154(b) by 0 days.

(21) Appl. No.: 17/816,814

(22) Filed: Aug. 2, 2022

(65) Prior Publication Data

US 2023/0420579 A1 Dec. 28, 2023

(30) Foreign Application Priority Data

Jun. 27, 2022 (CN) .......................... 202210732068.3

(51) Int. Cl.
*H01L 31/02* (2006.01)
*H01L 31/0224* (2006.01)
*H01L 31/05* (2014.01)

(52) U.S. Cl.
CPC .. *H01L 31/0201* (2013.01); *H01L 31/022433* (2013.01); *H01L 31/0504* (2013.01); *H01L 31/0508* (2013.01)

(58) Field of Classification Search
CPC ......... H01L 31/022425–022441; H01L 31/05; H01L 31/0508; H01L 31/0506
See application file for complete search history.

(56) References Cited

U.S. PATENT DOCUMENTS 10,002,984 B2  6/2018  Cho et al.
2007/0235077 A1  10/2007  Nagata et al.
(Continued)

FOREIGN PATENT DOCUMENTS

CN  106449831 A  2/2017
CN  209216999 U  8/2019
(Continued)

OTHER PUBLICATIONS

English machine translation for Lee et al. (WO 2020/138599) published Jul. 2, 2020.*
(Continued)

*Primary Examiner* — Christina Chern
(74) *Attorney, Agent, or Firm* — Pillsbury Winthrop Shaw Pittman, LLP; Chad Hammerlind (57) ABSTRACT

A photovoltaic module, including a plurality of solar cells each including a semiconductor substrate and a passivation layer, the semiconductor substrate is provided with an electrode including busbars, fingers, and electrode pads, each of the solar cells includes 9 to 20 busbars, each of the solar cells includes 40 to 100 fingers, and each of the busbars is connected to 3 to 10 electrode pads; a plurality of solder strips configured to connect the plurality of solar cells to each other, each of the solder strips fits the busbars and includes at least one boss portion soldered with the electrode pads, and a gradient of an outer surface of the boss portion along an extension direction of the solder strip ranges from 0° to 10°.

2 Claims, 6 Drawing Sheets

(56) References Cited

U.S. PATENT DOCUMENTS

| | | |
|---|---|---|
| 2015/0349145 A1 | 12/2015 | Morad et al. |
| 2016/0104810 A1 | 4/2016 | Adachi |
| 2017/0040481 A1 | 2/2017 | Cho et al. |
| 2018/0158970 A1 | 6/2018 | Yoon et al. |
| 2019/0296172 A1 | 9/2019 | Kang et al. |
| 2020/0091351 A1 | 3/2020 | Oh et al. |

FOREIGN PATENT DOCUMENTS

| | | | | |
|---|---|---|---|---|
| CN | 110611007 | A | | 12/2019 |
| CN | 113725307 | A | | 11/2021 |
| CN | 215342622 | U | * | 12/2021 ........... H01L 31/048 |
| DE | 102011001999 | A1 | | 10/2012 |
| DE | 202021105469 | U1 | | 11/2021 |
| EP | 3125301 | A1 | | 2/2017 |
| EP | 3128561 | A1 | | 2/2017 |
| JP | 2011205152 | A | | 10/2011 |
| JP | 2016213460 | A | | 12/2016 |
| JP | 2017038050 | A | | 2/2017 |
| JP | 7048808 | B1 | | 4/2022 |
| TW | 202002316 | A | | 1/2020 |
| WO | WO-2017171287 | A2 | * | 10/2017 ......... H01L 31/0201 |
| WO | WO-2020138599 | A1 | * | 7/2020 ....... H01L 31/02002 |
| WO | 2021098702 | A1 | | 5/2021 |

OTHER PUBLICATIONS

English translation of Deng et al.(CN 215342622) published Dec. 28, 2021.*
Office Action for related United Kingdom Patent Application 2216027.9, issued on Dec. 15, 2022, pp. 1-7.
Office Action in Chinese Patent Application No. 202210732068.3 dated Aug. 15, 2022, pp. 1-11.
Office Action in Japanese Patent Application No. 2021-012865 dated Sep. 13, 2022, pp. 1-12.
EP Application No. 22187921.6, Extended European search report dated Jun. 16, 2023.
1 Australian Application No. 2022209308, Examination Report dated Aug. 16, 2023.
Notice of Reasons for Refusal dated Mar. 18, 2024 issued in corresponding Japanese Patent Application No. 2023-021458.
Examination Report dated Mar. 21, 2024 issued in corresponding GB Patent Application No. GB2216027.9.

* cited by examiner

FIG. 10

PHOTOVOLTAIC MODULE

CROSS-REFERENCE TO RELATED APPLICATIONS

The present application claims priority to Chinese Application No. 202210732068.3, filed on Jun. 27, 2022, the content of which is incorporated herein by reference in its entirety.

TECHNICAL FIELD

The present disclosure relates to the technical field of photovoltaic technologies and, in particular, to a photovoltaic module.

BACKGROUND

With rapid development of science and technology and continuous improvement of people's living standards, more and more attention has been paid to environmental issues. In recent years, new energy technologies such as solar power generation technologies with less or no pollution to the environment, have developed rapidly and are widely used in various fields.

Photovoltaic modules in the related art are prone to damages and have low yield, which seriously affects service life and manufacturing costs of the photovoltaic modules.

SUMMARY

In view of this, the present disclosure provides a photovoltaic module, so as to solve the problems in the related art that the photovoltaic module is prone to damages and thus has low yield.

The present disclosure provides a photovoltaic module, including a plurality of solar cells each including a semiconductor substrate and a passivation layer, the semiconductor substrate is provided with an electrode including busbars, fingers, and electrode pads, each of the solar cells includes 9 to 20 busbars, each of the solar cells includes 40 to 100 fingers, and each of the busbars is connected to 3 to 10 electrode pads; and a plurality of solder strips configured to connect the plurality of solar cells to each other, each of the solder strips fits the busbars and includes at least one boss portion soldered with the electrode pads, and a gradient of an outer surface of the boss portion along an extension direction of the solder strip ranges from 0° to 10°.

In one or more embodiments, a distance between one end of the boss portion away from the solar cell and the solar cell ranges from 200 microns to 300 microns.

In one or more embodiments, the outer surface of the boss portion includes a first slope portion, and a gradient of a middle region of the first slope portion is greater than a top region and a bottom region of the first slope portion.

In one or more embodiments, the outer surface of the boss portion has a gradient in a range of 10° to 70° along a direction perpendicular to the extension direction of the solder strip, and the outer surface of the boss portion includes a second slope portion along the direction perpendicular to the extension direction of the solder strip, and a gradient of a middle region of the second slope portion is greater than a top region and a bottom region of the second slope portion.

In one or more embodiments, the semiconductor substrate includes a front surface and a back surface, the electrode includes a front electrode and a back electrode, the front electrode is provided on the front surface of the semiconductor substrate, the back electrode is provided on the back surface of the semiconductor substrate, each of the plurality of solder strips is connected to the front electrode of the solar cell and the back electrode of an adjacent solar cell, and the solder strips connected to the back electrode have a same thickness in a direction perpendicular to the solar cell.

In one or more embodiments, a projection of the boss portion on the solar cell is located on at least one side of a projection of a center line of the solder strip on the solar cell.

In one or more embodiments, an area of a projection of the boss portion on the electrode pad along a direction perpendicular to the solar cell is greater than 0.2 square millimeters.

In one or more embodiments, an area of a projection of the boss portion on the electrode pad along a vertical direction accounts for 30% to 80% of an area of the electrode pad.

In one or more embodiments, a distance between a projection of a center line of the boss portion on the solar cell and a center line of the electrode pad is A, and an extension length of the electrode pad in a direction perpendicular to the busbar is B, where $A \leq 0.4 B$.

In one or more embodiments, the solder strip includes a plurality of boss portions and at least one protruding portion, the protruding portion is located between the boss portions, and an area of a projection of the protruding portion on the solar cell is smaller than the boss portion on the solar cell.

In one or more embodiments, the electrode pad includes end electrode pads and a middle electrode pad, an area of the middle electrode pad is smaller than the end electrode pads, the end electrode pads are arranged on two ends of the busbar, and the middle electrode pad is arranged between the end electrode pads.

In one or more embodiments, a size of the electrode pad in a width direction of the busbar is greater than a width of the busbar, and a size of the electrode pad in an extension direction of the busbar is greater than a width of the finger.

In one or more embodiments, a size of the solder strip in the width direction of the busbar is smaller than the size of the electrode pad, and a diameter of the solder strip range from 0.1 mm to 0.5 mm.

In one or more embodiments, a number of the electrode pads is less than the fingers.

In one or more embodiments, the photovoltaic module further includes a converging busbar, wherein a cross section of the converging busbar is in a shape of a rectangle, a solar cell string is formed by the solar cells connected through the solder strips, and a solar cell layer is formed by a plurality of solar cell strings connected in series and/or in parallel through the converging busbar.

In one or more embodiments, the photovoltaic module further includes a front encapsulation structure, an adhesive film, and a back encapsulation structure, wherein the adhesive film includes a front adhesive film and a back adhesive film, the adhesive film is adhered to the solder strip and the solar cell, and the adhesive film is of a deformed groove structure matching the boss portion.

Other features and advantages of embodiments of the present disclosure will be set forth in the specification which follows and in part will become apparent from the specification or may be learned from practice of the embodiments of the present disclosure. The objectives and other advantages of the present disclosure may be realized and attained by the structure particularly pointed out in the specification and the accompanying drawings.

BRIEF DESCRIPTION OF DRAWINGS

In order to better illustrate the technical solutions in embodiments of the present disclosure, the accompanying drawings used in the description of the embodiments will be introduced below. It is apparent that, the accompanying drawings in the following description are only some embodiments of the present disclosure, and other drawings can be obtained by those of ordinary skill in the art from the provided drawings without creative efforts.

The accompanying drawings incorporated in and constitute a part of this specification are intended to illustrate embodiments consistent with the present disclosure and, together with the specification, serve to explain principles of the present disclosure.

DESCRIPTION OF EMBODIMENTS

To facilitate a better understanding of the technical solutions of the present disclosure, embodiments of the present disclosure are described in detail below with reference to the accompanying drawings.

It should be made clear that embodiments described are only some rather than all of the embodiments of the present disclosure. All other embodiments obtained by those of ordinary skill in the art based on the embodiments in the present disclosure without creative efforts fall within the protection scope of the present disclosure.

The terms used in the embodiments of the present disclosure are for the purpose of describing specific embodiments only, and are not intended to limit the present disclosure. As used in the embodiments and the appended claims of the present disclosure, the singular forms of "a/an", "the", and "said" are intended to include plural forms, unless otherwise clearly specified by the context.

It should be understood that the term "and/or" used herein is merely an association relationship describing associated objects, indicating that three relationships may exist. For example, A and/or B indicates that there are three cases of A alone, A and B together, and B alone. In addition, the character "/" herein generally means that associated objects before and after it are in an "or" relationship.

It should be noted that directional terms such as "above", "below", "left", "right" and the like described in the embodiments of the present disclosure are described with reference to the angles shown in the accompanying drawings, and should not be construed as limitations on the embodiments of the present disclosure. In addition, it should also be understood that, in the context, when one element is referred to as being formed "above" or "below" another element, it is possible that the one element is directly formed "above" or "below" the other element, or the element is formed "above" or "below" the other element via an intermediate element.

Specific embodiments are described below based on the structure of a photovoltaic module according to embodiments of the present disclosure.

The present disclosure provides a photovoltaic module, including a plurality of solar cells 1 and a plurality of solder strips 2. The solar cell 1 may be a single-piece solar cell or a half-cut solar cell. In the following embodiments, the solar cell 1 refers to a half-cut solar cell. The solar cell 1 includes a semiconductor substrate 11 and a passivation layer. The semiconductor substrate 11 is provided with an electrode 111. The electrode 111 includes busbars 112, fingers 113, and electrode pads 114. Each of the solar cells 1 has 9 to 20 busbars 112. Each of the solar cells 1 has 40 to 100 fingers 113. Each of the busbars 112 is connected to 3 to 10 electrode pads 114. The solder strip 2 is configured to connect the multiple solar cells 1. The solder strip 2 fits the busbar 112. The solder strip 2 has at least one boss portion 21 protruded therefrom and soldered with the electrode pad 114. A distance between one end of the boss portion 21 away from the solar cell 1 and the solar cell 1 ranges from 200 microns to 300 microns. A gradient of an outer surface of the boss portion 21 along an extension direction of the solder strip 2 ranges from 0° to 10°.

In the present disclosure, a protruding height of the boss portion on the solder strip and the gradient of the outer surface along the extension direction of the solder strips are defined to prevent stress of the boss portion on the solar cell during lamination, thereby preventing fragmentation of the solar cell, increasing the yield of the photovoltaic module, and thus ensuring the service life of the photovoltaic module.

Figure 1:
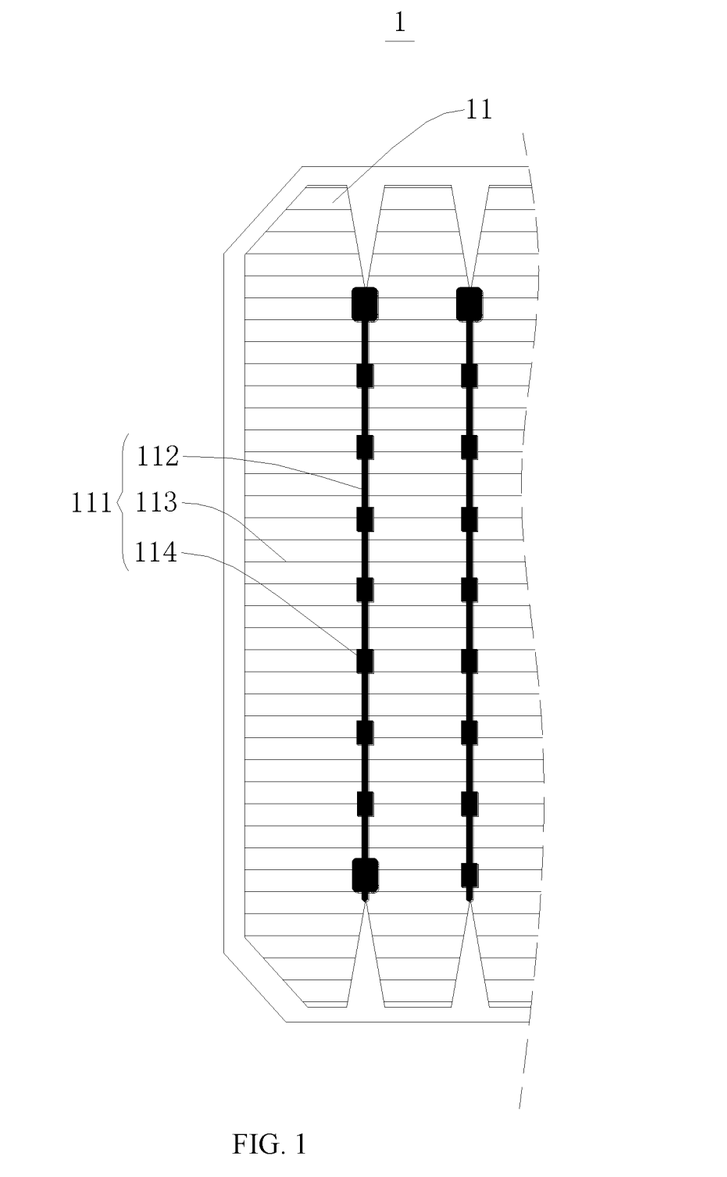
FIG. 1 is a schematic structural diagram of a solar cell according to one or more embodiments of the present disclosure.

Referring to FIG. 1 to FIG. 4, in FIG. 1, the solar cell 1 is a single-piece solar cell. The solar cell 1 includes a semiconductor substrate 11 and a passivation layer fitting to each other, which form a p-n junction structure. The sun shines on the semiconductor p-n junction to form new hole-electron pairs. Under the action of an internal electric field of the p-n junction, the holes flow from an n region to a p region, and the electrons flow from the p region to the n region. After a circuit is switched on, a current is formed.

In order to collect currents generated by various parts, the semiconductor substrate 11 is provided with an electrode 111. The electrode 111 includes busbars 112, fingers 113, and electrode pads 114. The busbar 112 and the finger 113 may be perpendicular to each other or arranged in intersection. The busbar 112 is electrically connected to the finger 113. Each solar cell 1 is provided with 9 to 20 busbars 112. For example, each solar cell 1 may be provided with 9, 10, 11, 12, 13, 14, 15, 16, 17, 18, 19, or 20 busbars 112. The busbars 112 may be parallel to each other. Each solar cell 1 is provided with 40 to 100 fingers 113. For example, each solar cell 1 may be provided with 40, 50, 60, 70, 80, 90, or 100 fingers 113. The fingers 113 may be parallel to each other.

Each busbar 112 is connected to 3 to 10 electrode pads. For example, each busbar 112 may be connected to 3, 4, 5, 6, 7, 8, 9, or 10 electrode pads. The electrode pads 114 may be in the shape of a circle, an oval, a semicircle, a trapezoid, a square, or any combination thereof. The electrode pads 114 may be evenly distributed on the busbar 112. The "evenly distributed" here means that the electrode pads 114 are equally spaced on the busbar 112.

With the above arrangement, the finger 113 can collect currents on regions of the solar cells 1 corresponding thereto, the finger 113 is electrically connected to the busbar 112, and the busbar 112 is provided with the electrode pad 114. In this way, when the solder strip 2 is electrically connected to the electrode pads 114, electric energy generated on the solar cell 1 can be collected through the solder strip 2.

Figure 5:
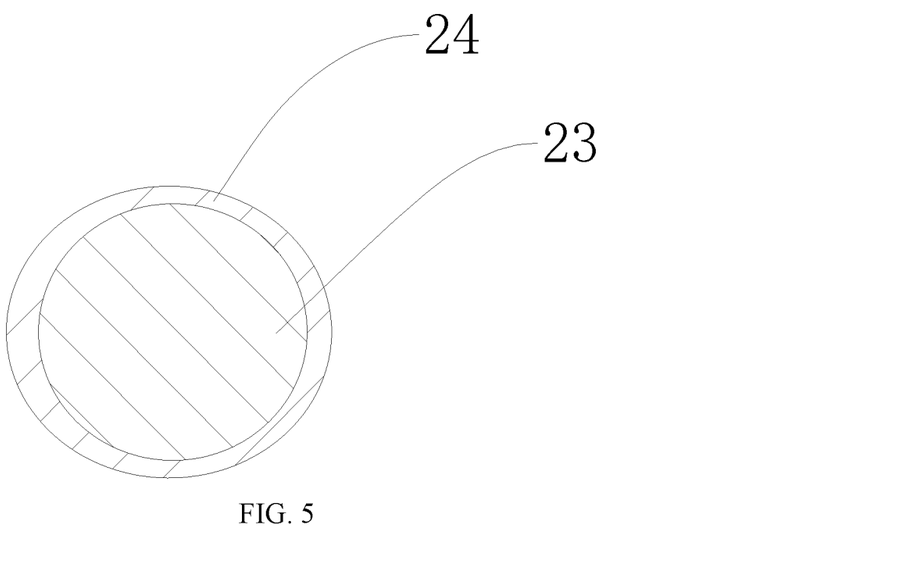
FIG. 5 is a cross-sectional view of a solder strip according to one or more embodiments of the present disclosure.

The solder strip 2 fits the busbar 112. Referring to FIG. 5, the solder strip 2 is composed of a core wire 23 and a tin layer 24. The core wire can transport current. The tin layer is configured to be electrically connected and physically connected to the electrode pad 114 on the solar cell 1. The solder strip 2 has at least one boss portion 21 protruded therefrom and soldered with the electrode pad 114. When the solder strip 2 is soldered with the solar cell 1, the outer tin layer melts, and the molten tin may slide to left and right sides of the solder strip 2 without deviation, thereby forming a structure with a cross section having a shape similar to an oval and connected to the electrode pad 114. The structure refers to the boss portion 21. Due to tension on a surface of the solar cell 1 and weldability between similar materials, the molten tin may only be connected to the electrode pad 114, and may not bond to other surfaces of the solar cell other than the electrode pad 114. A distance between one end of the boss portion 21 away from the solar cell 1 and the solar cell 1 ranges from 200 microns to 300 microns. That is, a height of the boss portion 21 ranges from 200 microns to 300 microns. In some embodiments, the distance between one end of the boss portion 21 away from the solar cell 1 and the solar cell 1 may be for example 200 microns, 210 microns, 220 microns, 230 microns, 240 microns, 250 microns, 260 microns, 270 microns, 280 microns, 290 microns, and 300 microns. When the height of the boss portion 21 is above 300 microns, it is easy to cause uneven pressure on the solar cell 1 during lamination, thereby resulting in fragmentation. In some embodiments, a gradient of an outer surface of the boss portion 21 along an extension direction of the solder strip 2 ranges from 0° to 10°. When the gradient is not within the range, the solar cell is more likely to have uneven fragmentation or adhesive films after lamination. The uneven adhesive films may lead to black EL and then reduce power generation efficiency. The extension direction of the solder strip 2 here may also be referred to as a length direction of the solder strip 2. The boss portion 21 may form a slope in the extension direction of the solder strip 2. The slope is connected as a transition to the remaining parts of the solder strip 2. For example, a gradient of the slope may be 0°, 1°, 2°, 3°, 4°, 5°, 6°, 7°, 8°, 9°, or 10°. It may be understood that the greater the gradient of the slope, the steeper the slope, and the more likely it is to cause uneven pressure on the solar cell 1 during lamination, thereby resulting in fragmentation.

In the above embodiment, a protruding height of the boss portion 21 on the solder strip 2 and a gradient of an outer surface along the extension direction of the solder strip 2 are defined to prevent stress of the boss portion 21 on the solar cell 1 during lamination, so as to prevent fragmentation of the solar cell 1.

In some embodiments, the boss portion 21 includes a first slope portion 211 on the outer surface along the extension direction of the solder strip 2, and a gradient of a middle region of the first slope portion 211 is greater than a top region and a bottom region of the first slope portion 211.

Figure 3:
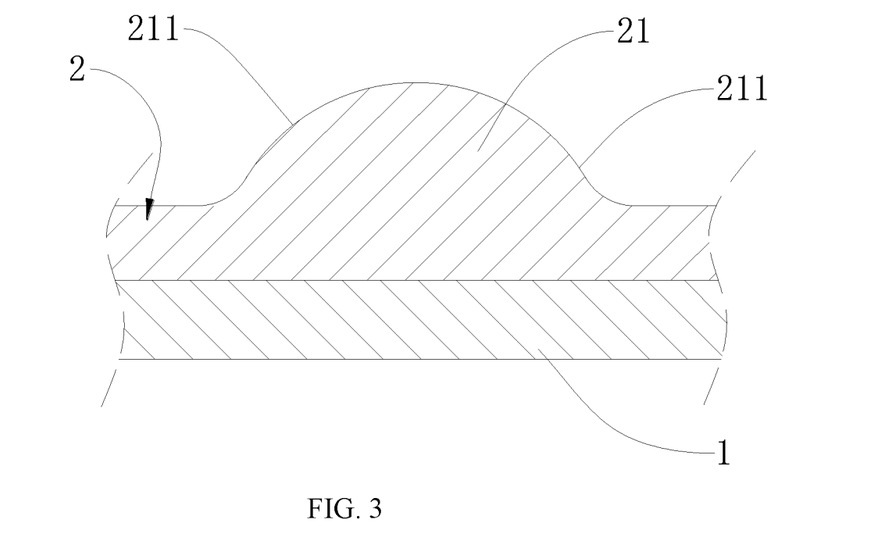
FIG. 3 is a schematic sectional view of a photovoltaic module along an extension direction of a solder strip according to one or more embodiments of the present disclosure.

Referring to FIG. 3, the boss portion 21 includes first slope portions 211 on the outer surface along the extension direction of the solder strip 2. It may be understood that, in the extension direction of the solder strip 2, the boss portion 21 includes two first slope portions 211 arranged symmetrically, tops of the two first slope portions 211 fit each other, and bottoms of the two first slope portions 211 are separated from each other. A gradient of a middle region of the first slope portion 211 is greater than a top region and a bottom region of the first slope portion 211. It is to be noted that the top region of the first slope portion 211 refers to a region from the top of the first slope portion accounting for 20% of the entire first slope portion along an extension direction of the first slope portion. The bottom region of the first slope portion 211 refers to a region from the bottom of the first slope portion accounting for 20% of the entire first slope portion along the extension direction of the first slope portion. Except for the top region of the first slope portion 211 and the bottom region of the first slope portion 211, the remaining parts refer to the middle region of the first slope portion 211. For example, the gradient of the middle region of the first slope portion 211 may range from 5° to 10°, which may be, for example, 5°, 6°, 7°, 8°, 9°, or 10°. The gradient of the top region and the bottom region of the first slope portion 211 ranges from 0° to 3°, which may be, for example, 0°, 1°, 2°, or 3°. In this way, the top and the bottom of the boss portion 21 are relatively flat, so as to reduce the stress on the solar cell 1 during lamination and reduce the probability of fragmentation of the solar cell 1.

In some embodiments, the outer surface of the boss portion 21 has a gradient in a range of 10° to 70° along a direction perpendicular to the extension direction of the solder strip 2, the outer surface of the boss portion 21 includes a second slope portion 212 along the direction perpendicular to the extension direction of the solder strip 2, and a gradient of a middle region of the second slope portion 212 is greater than a top region and a bottom region of the second slope portion 212. It is to be noted that the top region of the second slope portion 212 refers to a region from the top of the second slope portion accounting for 20% of the entire second slope portion along an extension direction of the second slope portion. The bottom region of the second slope portion 212 refers to a region from the bottom of the second slope portion accounting for 20% of the entire second slope portion along the extension direction of the second slope portion. Except for the top region of the second slope portion 212 and the bottom region of the second slope portion 212, the remaining parts refer to the middle region of the second slope portion 212. In some embodiments, the gradient of the middle region of the second slope portion 212 may range from 40° to 70°, which may be, for example, 40°, 50°, 60°, or 70°. The gradient of the top region and the bottom region of the second slope portion 212 ranges from 10° to 30°, which may be, for example, 10°, 20°, or 30°.

Figure 4:
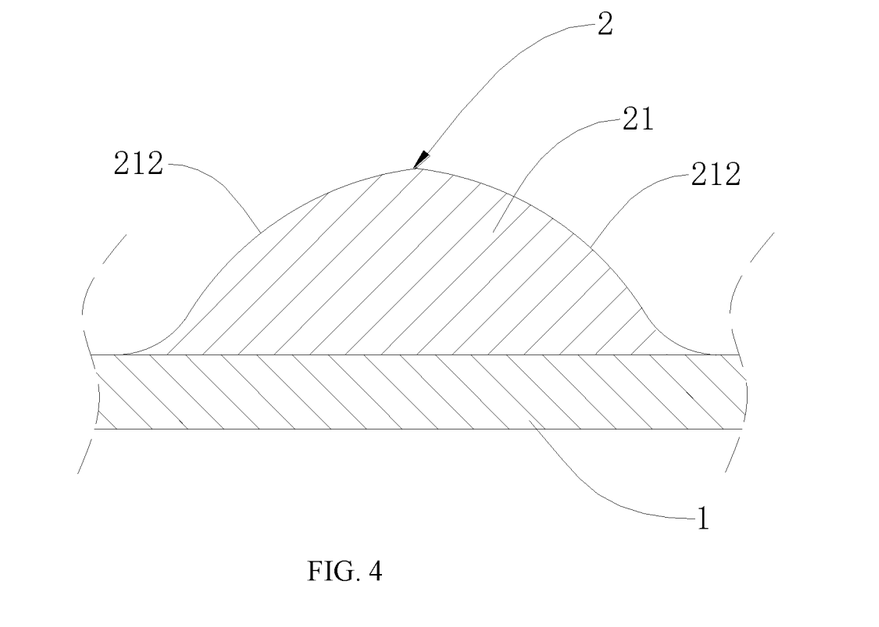
FIG. 4 is a schematic sectional view of a photovoltaic module along a direction perpendicular to an extension direction of a solder strip according to one or more embodiments of the present disclosure.

Referring to FIG. 4, the gradient of the second slope portion 212 ranges from 10° to 70°. For example, the gradient of the second slope portion 212 may be 10°, 20°, 30°, 40°, 50°, 60°, or 70°. It may be understood that, in the direction perpendicular to the extension direction of the solder strip 2, the boss portion 21 includes two second slope portions 212 arranged symmetrically, tops of the two second slope portions 212 fit each other, bottoms of the two second slope portions 212 are separated from each other, and the bottoms of the two second slope portions 212 are in physical contact with the electrode pads 114. A side part of the boss portion 21 may be in contact with the electrode pad 114 in the direction perpendicular to the extension of the solder strip 2, and the electrode pad 114 with an excessively large area may adversely affect power generation efficiency of the solar cell 1. Therefore, the electrode pad 114 generally has a relatively small area, and the second slope portion 212 is relatively steep due to the limitation of the area of the electrode pad 114. When the gradient of the second slope portion 212 is greater than 70°, the second slope portion 212 is excessively steep, which may lead to an increase in the stress during lamination, thereby resulting in fragmentation of the solar cell 1.

In some embodiments, the semiconductor substrate 11 includes a front surface and a back surface, the electrode 111 includes a front electrode 111 and a back electrode 111. The front surface of the semiconductor substrate 11 is provided with the front electrode 111, the back surface of the semiconductor substrate 11 is provided with the back electrode 111. Each of the plurality of solder strips 2 is connected to the front electrode 111 of the solar cell 1 and the back electrode 111 of the adjacent solar cell 1, and the solder strips 2 connected to the back electrodes 111 have a same thickness in a direction perpendicular to the solar cell 1.

Referring to FIG. 1, the semiconductor substrate 11 may be of a flat plate structure including a front surface and a back surface. The electrode 111 includes a front electrode 111 arranged on the front surface of the semiconductor substrate 11 and a back electrode 111 arranged on the back surface of the semiconductor substrate 11. The plurality of solar cells 1 in the photovoltaic module are arranged in sequence, and the front surfaces of the semiconductor substrates 11 thereof are all provided toward a same direction. Each of the plurality of solder strips 2 is connected to two solar cells 1 adjacent to the solder strip 2, so as to combine the solar cells 1 into a solar cell string. In other words, one end of the solder strip 2 is connected to the front electrode 111 of one solar cell 1, and the other end of the solder strip 2 is connected to the back electrode 111 of the adjacent solar cell 1.

Figure 6:
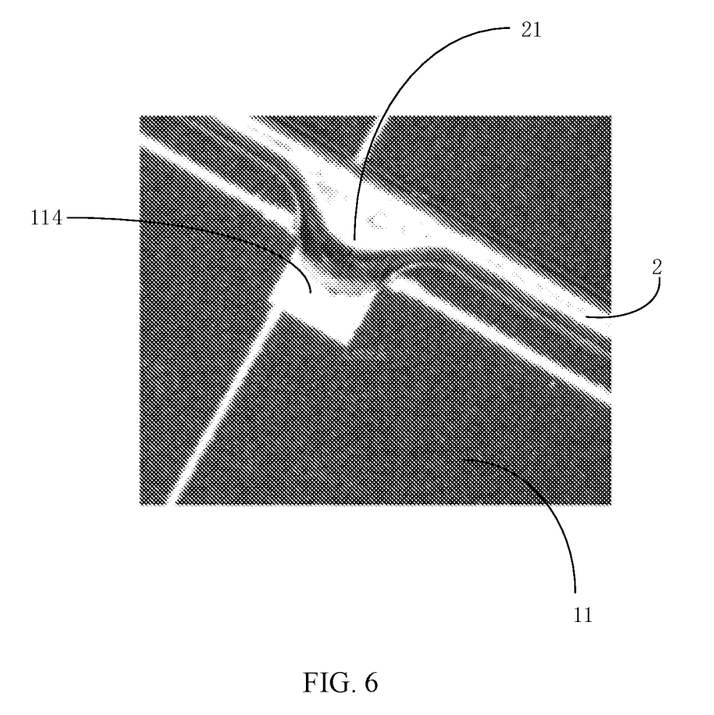
FIG. 6 is a schematic diagram (i) showing connection between a solder strip and a solar cell according to one or more embodiments of the present disclosure.
Figure 7:
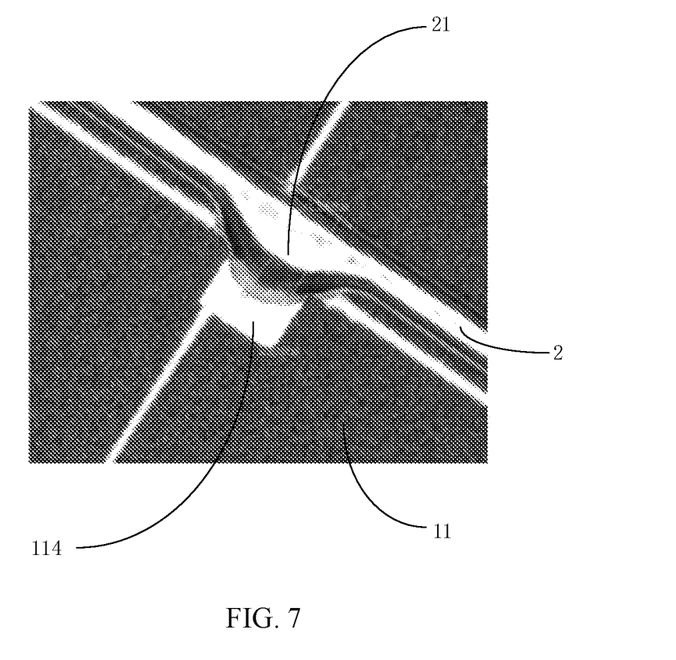
FIG. 7 is a schematic diagram (ii) showing connection between a solder strip and a solar cell according to one or more embodiments of the present disclosure.
Figure 8:
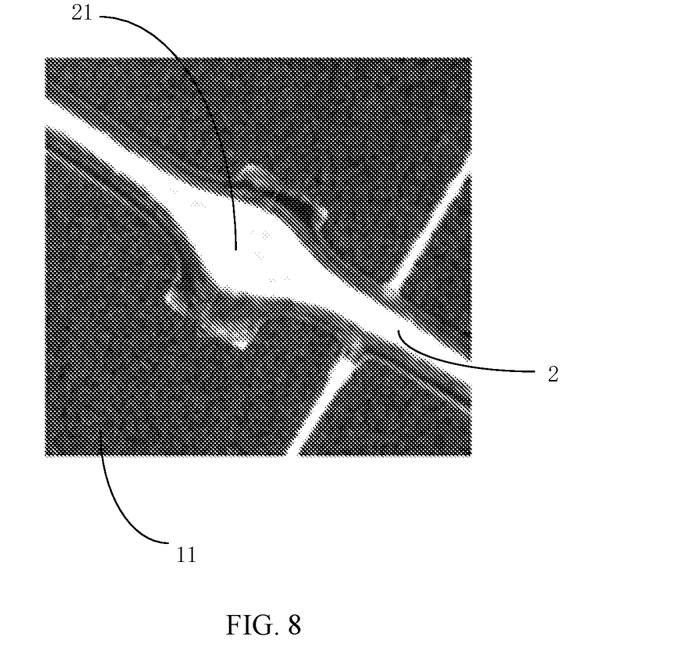
FIG. 8 is a schematic diagram (iii) showing connection between a solder strip and a solar cell according to one or more embodiments of the present disclosure.

Referring to FIG. 6, FIG. 7, and FIG. 8, in some embodiments, a projection of the boss portion 21 on the solar cell 1 is located on at least one side of a projection of a center line of the solder strip 2 on the solar cell 1.

Since the solder strip 2 may not completely overlap with the busbar 112 during actual soldering, part of the boss portion 21 may deviate from the corresponding electrode pad 114. In this case, in order to ensure the connection between the boss portion 21 and the electrode pad 114, the boss portion 21 deflects toward the electrode pad 114 to achieve a stable connection. A projection of the boss portion 21 on the solar cell 1 along a direction perpendicular to the solar cell 1 is a closed pattern, and a projection of the center line of the solder strip 2 on the solar cell 1 is a line-shaped pattern. The closed pattern is located on either side of the line-shaped pattern. The solder strip 2 may completely overlap with the busbar 112 during actual soldering. In this case, a projection of the boss portion 21 on the solar cell 1 along the direction perpendicular to the solar cell 1 is a closed pattern, and a projection of the center line of the solder strip 2 on the solar cell 1 is a line-shaped pattern. The closed pattern overlaps with the line-shaped pattern.

In some embodiments, an area of the boss portion 21 projected on the electrode pad 114 along a direction perpendicular to the solar cell 1 is greater than 0.2 square millimeters. In some embodiments, the area of the boss portion 21 projected on the electrode pad 114 along the direction perpendicular to the solar cell 1 is greater than 0.2 square millimeters and less than square millimeters.

The area of the boss portion 21 projected on the electrode pad 114 along the direction perpendicular to the solar cell 1 is an area of an effective connection part between the boss portion 21 and the electrode pad 114. It may be understood that the greater the area of the part, the more stable the connection between the boss portion 21 and the electrode pad 114. In order to ensure the connection between the boss portion 21 and the electrode pad 114, requirements for the connection strength can be met when the area of the part is greater than 0.2 square millimeters. According to theoretical calculations and experiments, when the area of the boss portion 21 projected on the electrode pad 114 along the direction perpendicular to the solar cell 1 is 0.2 square millimeters, the tension required to separate the boss portion 21 from the solar cell is 0.33 N. When the area of the boss portion 21 projected on the electrode pad 114 along the direction perpendicular to the solar cell 1 is 0.24 square millimeters, the tension required to separate the boss portion 21 from the solar cell is 0.53 N. When the area of the boss portion 21 projected on the electrode pad 114 along the direction perpendicular to the solar cell 1 is 0.4 square millimeters, the tension required to separate the boss portion 21 from the solar cell is 1.14 N.

In some embodiments, an area of the boss portion 21 projected on the electrode pad 114 along a vertical direction accounts for 30% to 80% of an area of the electrode pad 114. For example, the area of the boss portion 21 projected on the electrode pad 114 along the vertical direction may account for 30%, 40%, 50%, 60%, 70%, or 80% of the area of the electrode pad 114. In some embodiments, the area of the boss portion 21 projected on the electrode pad 114 along the vertical direction accounts for 40% to 60% of the area of the electrode pad 114.

The area of the boss portion 21 projected on the electrode pad 114 along the direction perpendicular to the solar cell 1 refers to the area of the effective connection part between the boss portion 21 and the electrode pad 114. When the area of the boss portion 21 projected on the electrode pad 114 along the vertical direction is less than 30% of the area of the electrode pad 114, the remaining area of the electrode pad 114 is excessively large relative to the boss portion 21, which affects the power generation efficiency of the photovoltaic module. When the area of the boss portion 21 projected on the electrode pad 114 along the vertical direction is greater than 80% of the area of the electrode pad 114, the remaining area of the electrode pad 114 is excessively small relative to the boss portion 21, and the boss portion 21 may easily contact a part of the solar cell 1 other than the electrode pad 114, which affects the power generation efficiency of the photovoltaic module and easily leads to the fragmentation of the solar cell 1.

In some embodiments, a distance between a projection of a center line of the boss portion 21 on the solar cell 1 and a center line of the electrode pad 114 is A, and an extension length of the electrode pad 114 in a direction perpendicular to the busbar 112 is B, where $A \leq 0.4B$. Optionally, $0 < A < 0.2$.

A distance between a center line of the projection of the boss portion 21 on the solar cell 1 along the direction perpendicular to the solar cell 1 and the center line of the electrode pad 114 can represent a degree of overlapping between the boss portion 21 and the electrode pad 114. The extension length of the electrode pad 114 in the direction perpendicular to the busbar 112 may also be referred to as a width of the electrode pad 114. When the distance between the projection of the center line of the boss portion 21 on the solar cell 1 and the center line of the electrode pad 114 is excessively large and the extension length of the electrode pad 114 in the direction perpendicular to the busbar 112 is excessively small, the boss portion 21 excessively deflects in the direction perpendicular to the extension direction of the busbar 112 relative to the electrode pad 114, which may adversely affect the connection between the boss portion 21 and the electrode pad 114. On this basis, A≤0.4 B is defined to ensure a firm connection between the boss portion 21 and the electrode pad 114, so as to ensure structural strength and durability of the photovoltaic module.

In some embodiments, the solder strip 2 includes a plurality of boss portions 21, each solder strip 2 further includes at least one protruding portion 22. The protruding portion 22 is located between the boss portions 21, and a projection area of the protruding portion 22 on the solar cell 1 is smaller than the boss portion 21 on the solar cell 1.

Figure 2:
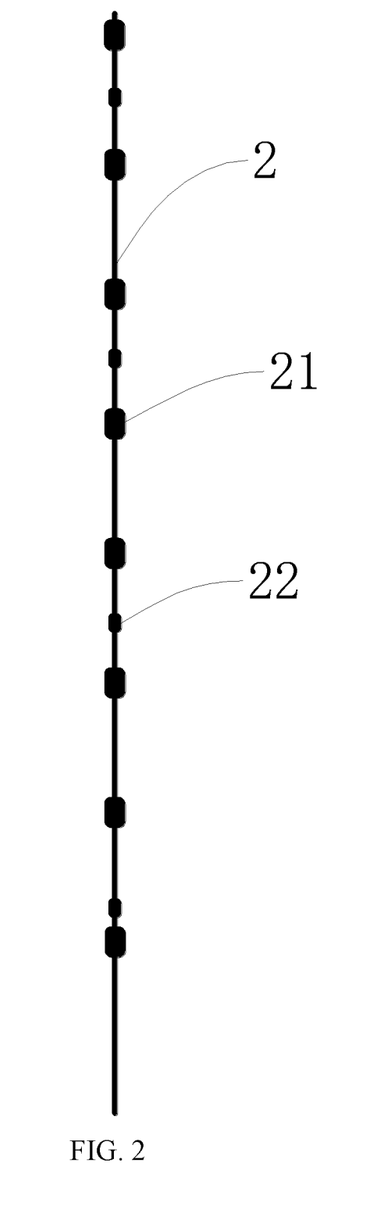
FIG. 2 is a schematic structural diagram of a solder strip according to one or more embodiments of the present disclosure.
Figure 9:
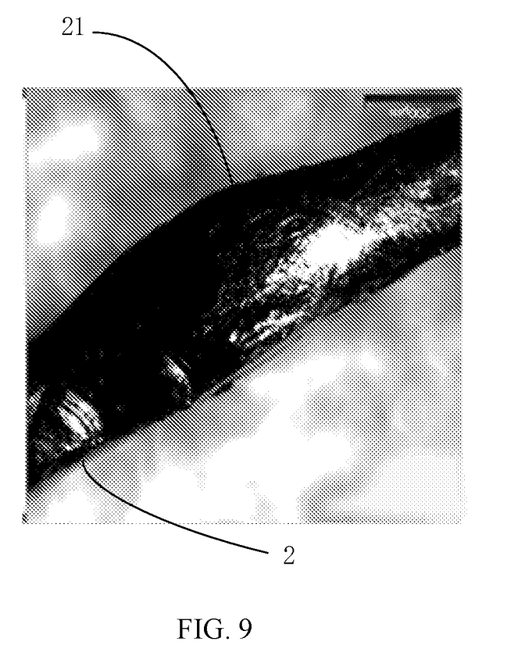
FIG. 9 is a schematic structural diagram (i) of a boss portion on a solder strip according to one or more embodiments of the present disclosure.
Figure 10:
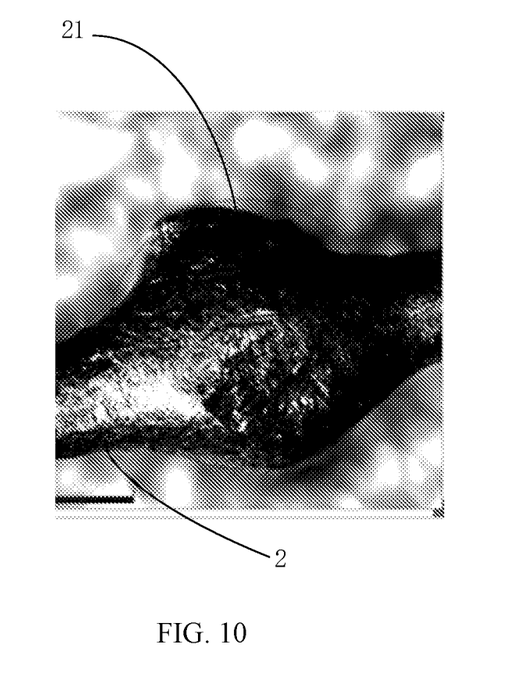
FIG. 10 is a schematic structural diagram (ii) of the boss portion on a solder strip according to one or more embodiments of the present disclosure.

Referring to FIG. 2, FIG. 9, and FIG. 10, a small protrusion also exists in a region of a non-electrode pad 114 on the solder strip 2. The boss portion 21 and the protruding portion 22 are generated due to the following reasons. When the solder strip 2 is soldered, a series welder may press the solder strip 2 with a pin in the region of the non-electrode pad 114, so that the solder strip 2 does not deflect. A structure of the series welder is introduced as follows. A heating platform is provided at the bottom where a back solder strip is connected to the solar cell, an upper surface is provided with a heating tube. A non-electrode pad position of the solder strip on the upper surface is pressed with the pin, and the tube is turned on to heat and melt soldering tin, which enables a top surface of the back solder strip to be a flat plane without protrusions. Due to the pressure, the tin layer on the solder strip 2 may randomly gather in a region between the pins to form larger protrusions and smaller protrusions. The larger protrusions are generated in an electrode pad region, which are the boss portions 21, the smaller protrusions are the protruding portions 22. In order to prevent excessive shielding of the solar cell 1 by the protruding portion 22, a projection area of the protruding portion 22 on the solar cell 1 is required to be smaller than the protruding boss portion 21 on the solar cell 1, so as to ensure the power generation efficiency of the photovoltaic module.

In some embodiments, the electrode pad 114 includes end electrode pads 114 and a middle electrode pad 114, an area of the middle electrode pad 114 is smaller than the end electrode pad 114. The end electrode pads 114 are arranged on two ends of the busbar 112, and the middle electrode pad 114 is arranged between the end electrode pads 114.

The electrode pads 114 on the busbar 112 are soldered with the boss portions 21 of the solder strip 2 in a one-to-one correspondence, since the stress at a junction between the two ends of the busbar 112 and the solder strip 2 is relatively concentrated, the junction is prone to fracture. Therefore, the electrode pad 114 is divided into end electrode pads 114 and a middle electrode pad 114, an area of the middle electrode pad 114 is smaller than the end electrode pad 114, and the middle electrode pad 114 is arranged between the end electrode pads 114. The electrode pad 114 at the end of the busbar 112 has a relatively large area, so that an area of contact between the boss portion 21 and the end electrode pad 114 is increased, thereby improving strength of the connection therebetween.

In some embodiments, the size of the electrode pad 114 of the photovoltaic module in the width direction of the busbar 112 is greater than the width of the busbar 112, and the size of the electrode pad 114 in extension direction of the busbar 112 is greater than the width of the finger 113. The size of the electrode pad 114 in the width direction of the busbar 112 being greater than the width of the busbar 112 enables the electrode pad 114 to provide a greater solder connection range than the busbar 112, thereby ensuring the connection between the boss portion 21 and the electrode pad 114.

In some embodiments, the size of the solder strip 2 of the photovoltaic module in the width direction of the busbar 112 is smaller than the size of the electrode pad 114, and diameter of the solder strip 2 ranges from 0.1 mm to 0.5 mm. The size of the solder strip 2 in the width direction of the busbar 112 being smaller than the size of the electrode pad 114 can prevent shielding of a power generation part of the solar cell 1 due to an excessively large width of the solder strip 2.

In some embodiments, a number of the electrode pads 114 of the photovoltaic module is less than the fingers. The size of the electrode pad 114 in the extension direction of the busbar 112 is larger than width of the finger 113, so that the area and the range of the electrode pads 114 are further increased, thereby ensuring the connection between the boss portion 21 and the electrode pad 114.

The diameter of the solder strip 2 ranges from 0.1 mm to 0.5 mm, so that structural strength of the solder strips 2 is ensured, which can also prevent an excessively large thickness of the solder strip 2, thereby preventing the shielding of the solar cell 1 by the solder strip 2.

The number of the electrode pads 114 is less than the fingers, so as to ensure that the number of the electrode pads 114 is within a reasonable range, thereby preventing the influence on power generation efficiency of the photovoltaic module due to excessive electrode pads 114.

In the above embodiments, the electrode pads can be fit with and connected to the protruding portions to improve the efficiency of photovoltaic power generation on the premise of ensuring a connection effect.

In some embodiments, the photovoltaic module further includes a converging busbar, a cross section of the converging busbar is in a shape of a rectangle. Solar cell strings are formed by the solar cells 1 connected through the plurality of the solder strips 2, and a solar cell layer is formed by the plurality of solar cell strings connected in series and/or in parallel through the converging busbar.

The converging busbar may be any metal strip with good electrical conductivity, a cross section of the converging busbar is in a shape of a rectangle, and the converging busbar may be of a flat strip structure. The plurality of solar cells 1 are connected into a string to form a solar cell string through the plurality of the solder strips 2. A plurality of solar cell strings are connected in series and/or in parallel through the converging busbar to form a solar cell layer.

In some embodiments, the photovoltaic module further includes a front encapsulation structure, an adhesive film, and a back encapsulation structure. The adhesive film includes a front adhesive film and a back adhesive film. The adhesive film is adhered to the solder strip 2 and the solar cell 1. The adhesive film has a deformed groove structure matching the boss portion 21.

The front encapsulation structure and the back encapsulation structure may be glass. The front adhesive film and the back adhesive film may be common ethylene vinyl acetate (EVA) adhesive films. The adhesive film is adhered to the solder strip 2 and the solar cell 1, and the adhesive film has a deformed groove structure matching the boss portion 21, so that the boss portion 21 can be received in the deformed groove during lamination, thereby preventing damages to the solar cell 1 under pressure.

In the present disclosure, the gradient may also be referred to as a slope ratio, which is a proper term used to indicate a degree of steepness of a surface unit, and refers to a ratio of a vertical height of a slope to a distance in a horizontal direction. This value may be stated as a percentage or thousandth ratio of a tangent of a trig function, i.e. "a climbing height divided by a moving distance on a horizontal plane." A measurement method may be obtained by fitting a virtual plane on a measured slope and then measuring a ratio of a vertical height of the virtual plane to a distance in a horizontal direction.

In any one of the above embodiments, the solar cell may be any one of a conventional monocrystalline cell, a passivated emitter and rear cell (PERC) monocrystalline cell, a heterojunction with intrinsic thin-layer (HJT) cell. Compared with the conventional cell, the PERC cell shows a good efficiency advantage, which can improve the industrial efficiency by 1% to 1.5% than the conventional cell. The HJT cell has many advantages, such as low energy consumption, a simple process, and a low temperature coefficient, and is a better efficient silicon-based solar cell scheme. The conventional monocrystalline cell, the PERC monocrystalline cell, and the HJT cell all have a good characteristic of converting light energy into electric energy, which can improve light energy conversion efficiency of the solar cell and then improve the utilization of the light energy of the solar cell. That is, the conventional monocrystalline cell, the PERC monocrystalline cell, and the HJT cell all have good characteristics of converting light energy into electric energy, which can improve light energy conversion efficiency of the solar cell and improve the utilization of the light energy.

Examples of the solar cell are given below.

Tunnel oxide passivated contact (TOPCon) solar cells rely on a "tunneling effect" to achieve back surface passivation. A back surface structure of an existing TOPCon solar cell includes a semiconductor substrate, a tunnel oxide layer, a doped conductive layer, and a back surface passivation layer sequentially from inside to outside. An N-type TOPCon is diffused in boron to form borosilicate glass (BSG). The BSG is more difficult to clean and remove than phosphorosilicate glass, which is generally removed with an oxidizing mixed acid solution. After the surface is cleaned and dried, the back surface is polished. Currently, a polished state of the back surface of the semiconductor substrate has certain influence on an ultra-thin tunnel oxide layer with a nanometer thickness, which easily leads to an increase in contact resistivity between the tunnel oxide layer and the semiconductor substrate, thereby easily leading to fluctuation of a fill factor of the solar cell and affecting the photoelectric conversion efficiency of the solar cell.

The solar cell includes: a semiconductor substrate, the semiconductor substrate has a first texture structure on a back surface, the first texture structure includes two or more first substructures that are at least partially stacked, for the two or more first substructures that are at least partially stacked, in a direction away from the back surface and perpendicular to the back surface, a distance between a top surface of the outermost first substructure and a top surface of the first substructure adjacent thereto is less than or equal to 2 µm, and a one-dimensional size of the top surface of the outermost first substructure is less than or equal to 45 µm, the semiconductor substrate has a second texture structure on a front surface, and the second texture structure including pyramidal microstructures; a first passivation layer located over the front surface of the semiconductor substrate; a tunnel oxide layer located over the first texture structure on the back surface of the semiconductor substrate; a doped conductive layer located over a surface of the tunnel oxide layer, the doped conductive layer and the semiconductor substrate have doped elements of a same conductivity type; and a second passivation layer located over a surface of the doped conductive layer.

The front surface of the semiconductor substrate may refer to a light receiving surface, that is, a surface receiving sunlight (light receiving surface). The back surface of the semiconductor substrate may refer to a surface opposite to the front surface. In some embodiments, the solar cell formed is a single-sided solar cell, the front surface may refer to the light receiving surface, and the back surface may refer to a backlight surface. In some embodiments, the solar cell formed is a double-sided solar cell, and the front surface and the back surface may both be light receiving surfaces.

As an optional technical solution of the present disclosure, the semiconductor substrate is an N-type crystalline silicon substrate (or silicon wafer). A P-type doped layer may be formed on the front surface of the semiconductor substrate by any one or more processes of high-temperature diffusion, slurry doping, and ion implantation, so as to form a PN junction in the semiconductor substrate. In some embodiments, the semiconductor substrate may be one of a monocrystalline silicon substrate, a polycrystalline silicon substrate, a microcrystalline silicon substrate, and a silicon carbide substrate.

The above are only preferred embodiments of the present disclosure and are not intended to limit the present disclosure. Any modifications, equivalent substitutions, improvements and the like made within the principle of the present disclosure should fall within the protection scope of the present disclosure.

What is claimed is:

1. A photovoltaic module, comprising: a first solar cell, a second solar cell, and a solder strip, wherein each of the first solar cell and the second solar cell includes a front electrode and a back electrode, and each of the front electrode and the back electrode comprises fingers and a busbar connected to the fingers, the busbar and the solder strip extend in a first direction, and the fingers extend in a second direction perpendicular to the first direction, the solder strip is connected to the busbar of the front electrode of the first solar cell and the busbar of the back electrode of the second solar cell, the solder strip includes a core wire and a tin layer coating an outer surface of the core wire, the busbar of the front electrode of the first solar cell includes a plurality of electrode pads, and the tin layer of the solder strip is in contact with the plurality of electrode pads, the solder strip includes a plurality of boss portions soldered with the plurality of electrode pads respectively, and the solder strip excluding the plurality of boss portions does not overlap with the busbar.

2. The photovoltaic module according to claim 1, wherein a distance between a projection of a center line of each boss portion and a center line of the respective electrode pad where the boss portion is soldered is A, and an extension length of the respective electrode pad in the second direction is B, where A≤0.4B.

* * * * *